(12) United States Patent
Chen

(10) Patent No.: US 6,843,407 B2
(45) Date of Patent: Jan. 18, 2005

(54) SOLDER BUMP FABRICATION METHOD AND APPARATUS

(75) Inventor: Chih-Ming Chen, Taipei (TW)

(73) Assignee: Asustek Computer, Inc., Taipei (TW)

( * ) Notice: Subject to any disclaimer, the term of this patent is extended or adjusted under 35 U.S.C. 154(b) by 0 days.

(21) Appl. No.: 10/201,935

(22) Filed: Jul. 25, 2002

(65) Prior Publication Data

US 2003/0071112 A1 Apr. 17, 2003

(30) Foreign Application Priority Data

Oct. 12, 2001 (TW) .......................... 90125268 A

(51) Int. Cl.[7] .................. B23K 1/20; B23K 31/02
(52) U.S. Cl. ............................... 228/215; 228/245
(58) Field of Search .................. 228/245–262, 228/180, 22, 214, 215; 257/737, 738; 438/613–617

(56) References Cited

U.S. PATENT DOCUMENTS

| | | | | | |
|---|---|---|---|---|---|
| 5,349,495 | A | * | 9/1994 | Visel et al. ................. | 361/774 |
| 5,863,812 | A | * | 1/1999 | Manteghi ................... | 438/108 |
| 2001/0000156 | A1 | * | 4/2001 | Cheng ....................... | 438/612 |
| 2002/0179692 | A1 | * | 12/2002 | Tung et al. ................ | 228/215 |
| 2003/0011070 | A1 | * | 1/2003 | Iijima et al. ............... | 257/734 |

FOREIGN PATENT DOCUMENTS

| | | |
|---|---|---|
| CN | 1303230 A | 7/2001 |
| CN | 1316175 A | 10/2001 |
| TW | 437031 | 5/2001 |

* cited by examiner

*Primary Examiner*—Kiley S. Stoner
*Assistant Examiner*—Kevin McHenry
(74) *Attorney, Agent, or Firm*—Birch, Stewart, Kolasch & Birch, LLP

(57) ABSTRACT

A solder bump fabrication method is disclosed. First, a printed circuit board, having a plurality of devices, is provided. A material is formed on the printed circuit board, and it is disposed between pins of the devices to prevent the devices from short-circuiting due to the solder bumps. Then, the solder bumps are formed on the pins of the devices so that the devices are fixed on the printed circuit board. The printed circuit board is passed through an infrared oven to melt the solder bumps. The material separates the solder bumps attached to the pins of the devices so that the devices are prevented from short-circuiting.

18 Claims, 5 Drawing Sheets

# SOLDER BUMP FABRICATION METHOD AND APPARATUS

BACKGROUND OF THE INVENTION

1. Field of the Invention

The invention relates to a solder bump fabrication method and apparatus; in particular, to a method and apparatus that can form the solder bumps on a printed circuit board without causing devices on the printed circuit board to short circuit.

2. Description of the Related Art

The main purpose of electronic packaging technology is to provide products with good function, high reliability, and fast cooling to avoid damage to circuits by overheating. Presently, in order to upgrade the function of electronic products, many companies pay attention to developing a new process that can replace the present techniques worldwide.

Conventionally, the following modes are adopted by chip packaging: DIP (dual in line package), SK-DIP (skinny DIP), and PGA (pin grid array). However, the occupied volume is too large and the input/output density on chip is too little; therefore, this package type has almost been replaced by surface mounting technology (SMT). The SMT cannot, however, satisfy the demand for products with high function and high density, so chip-on-board (COB) technology was developed. Chip-on-board technology bonds the chip to the surface of a printed circuit board by solder bumps.

In chip-on-board technology, the multichip module package mounts many bare chips on a printed circuit board. The multichip module package method comprises the following steps. First, a plurality of devices, such as chips, are inserted onto a printed circuit board. Then, the solder bumps are formed on the pins of the devices, and the printed circuit board having the devices is passed through an infrared oven to melt the solder bumps. Thus, the devices are soldered on the printed circuit board.

The key advantage of multichip modules is reduction of the space occupied by the element, to shorten the delay time of signal by the shorter line, to cut down the capacitance and inductance of all circuits in the whole system. Therefore, the density of system package is promoted and system function is increased.

However, there are still some problems generated during the conventional method. As the density of the chips on printed circuit board increases, gaps between the devices decrease. Therefore, extra solder bumps other than those attached to the device pins are difficult to remove due to small gaps. In addition, the devices on the printed circuit board easily short circuit, and solder bump fabrication cannot easily attain a preset criterion. As a result, the yield of the printed circuit boards decreases, and the fabrication cost and time increase.

Furthermore, referring to FIG. 1a, it is noted that there is a fixture 110 for printing characters on a printed circuit board 120 during the conventional method. The fixture 110 is simply provided with a first through hole 111 for an indication marker to pass through so that the characters are printed on the printed circuit board 120 having a plurality of devices with pins 123.

Referring to FIG. 1b, the indication marker can pass through the first through hole 111 to form the character 124, such as manufacturers, on the printed circuit board 120. Then, solder bumps 121 are disposed on the pins 123 of the devices on the printed circuit board 120.

As stated above, since the gaps between adjacent pins 123 are small, extra solder bumps are difficult to remove, and the devices on the printed circuit board are easy to short circuit.

SUMMARY OF THE INVENTION

In order to address the disadvantages of the aforementioned electronic packaging technology, the invention provides a method and apparatus that can form the solder bumps on a printed circuit board without causing devices on the printed circuit board to short circuit.

Accordingly, the invention provides a solder bump fabrication method that comprises following steps. First, a printed circuit board, having a plurality of devices, is provided. A material is formed on the printed circuit board, and it is disposed between pins of the devices so that the material prevents the devices from short-circuiting due to solder bumps. Then, solder bumps are formed on the pins of the devices so that the devices are fixed on the printed circuit board. The printed circuit board is passed through an infrared oven to melt the solder bumps. Finally, extra solder bumps other than those attached to the device pins are removed, and the solder bumps attached to the pins of the devices are separated by material so that the devices are prevented from short circuiting.

In one preferred embodiment, the material is formed on the printed circuit board by screen printing or coating.

In another preferred embodiment, the material is an indication marker for the printed circuit board.

It is understood that the material may be white paint.

In another preferred embodiment, the invention provides an apparatus with a plurality of through holes corresponding to gaps between the pins on the printed circuit board. Thus, isolated portions are formed between the pins on the printed circuit board while the characters are printed on the printed circuit board.

In another preferred embodiment, the apparatus may be a screen-printing fixture.

BRIEF DESCRIPTION OF THE DRAWINGS

The invention is hereinafter described in detail with reference to the accompanying drawings in which:

FIG. 1b is a schematic view depicting a printed circuit board fabricated by the apparatus in FIG. 1a;

DETAILED DESCRIPTION OF THE INVENTION

Figure 2:
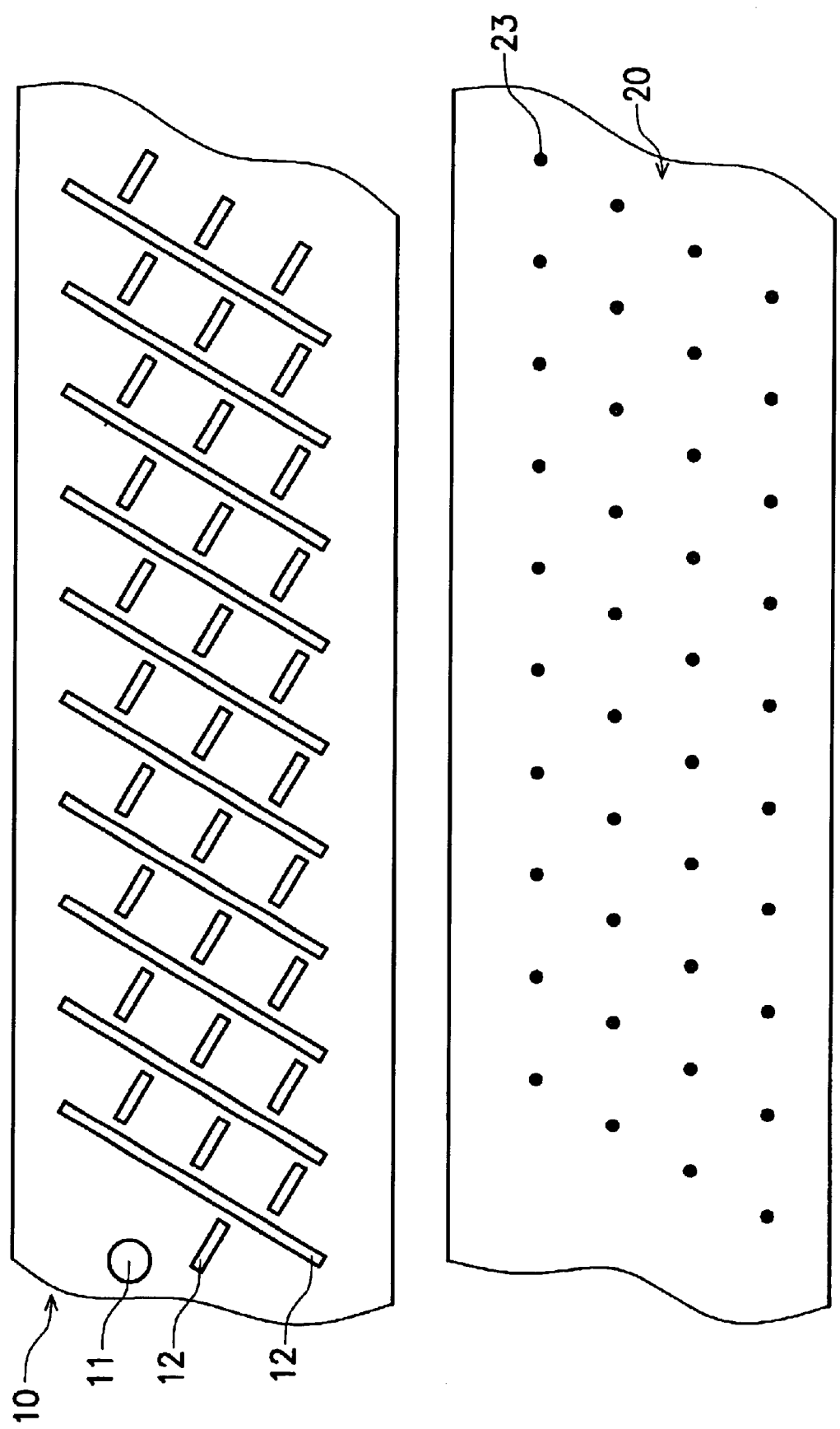
FIG. 2 is a schematic view depicting an apparatus for printing characters on a printed circuit board as disclosed in this invention.

Referring to FIG. 2, a fixture 10 for printing characters on a printed circuit board as disclosed in this invention is shown. In prior art, such fixture is simply provided with a first through hole for an indication marker to pass through so that characters are printed on the printed circuit board. Comparing with the conventional fixture, the fixture 10 is provided with a first through hole 11 and a plurality of second through holes 12. The second through holes 12 correspond to gaps between pins 23 of devices on a printed circuit board 20.

Figure 4:
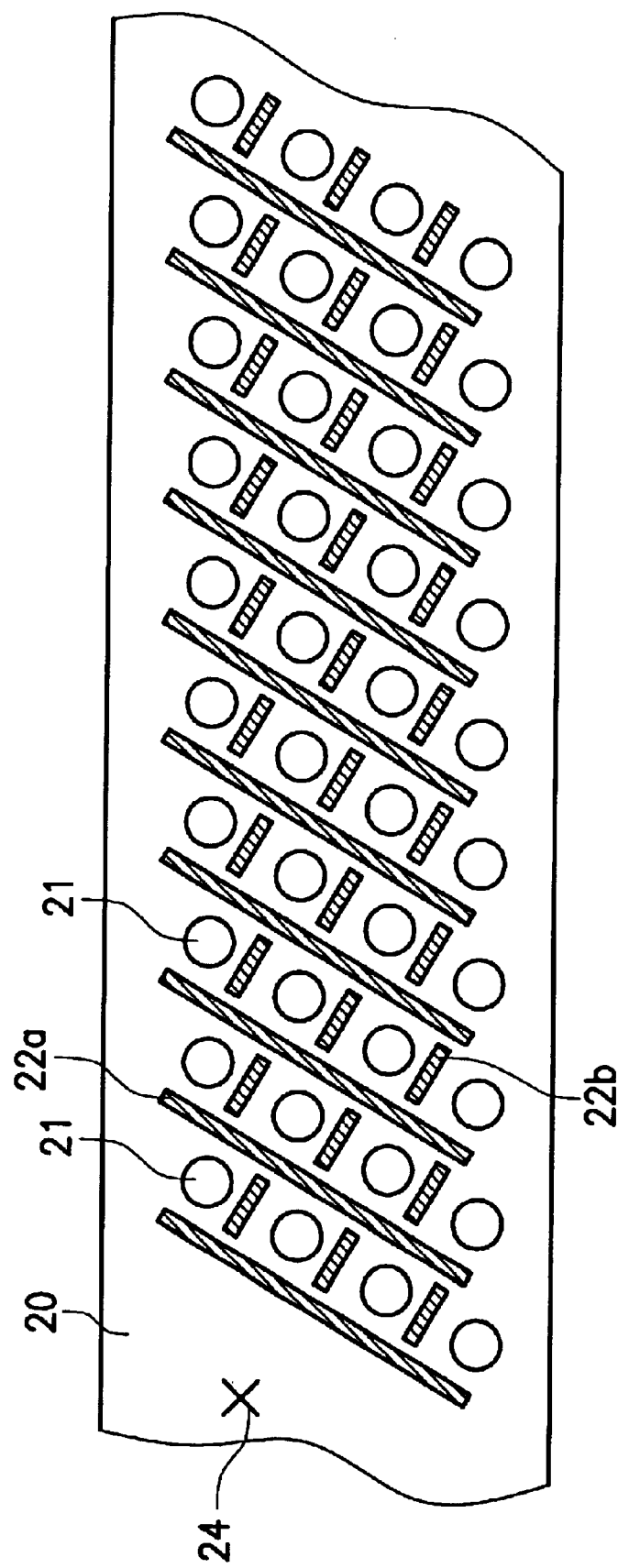
FIG. 4 is a schematic view depicting a printed circuit board fabricated by the method in FIG. 3.

Like the conventional fixture, the indication marker can pass through the first through hole 11 to form the characters, such as manufacturers, on the printed circuit board 20. However, unlike the conventional fixture, a material can also be formed on the gaps between adjacent pins 23 while the characters are printed on the printed circuit board 20. The material is free of soldering, and forms insulating portions 22a, 22b as shown in FIG. 4. The insulating portions 22a, 22b will be described below in detail. It is noted that the fixture 10 is re-designed based on the conventional fixture; therefore, there is no additional step in the process of this invention. As a result, fabrication time is the same as the conventional process.

Figure 3:
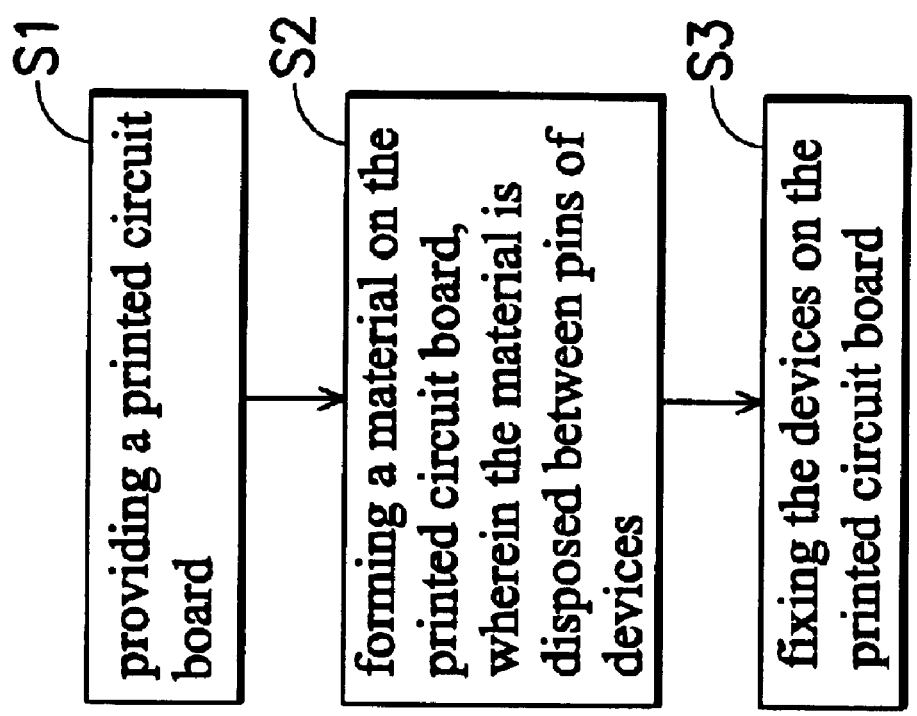
FIG. 3 is a flow chart depicting a solder bump fabrication method as disclosed in this invention.

Referring to FIG. 3, a solder bump fabrication method, using the fixture 10, comprises the following steps. First, a printed circuit board, having a plurality of devices, is provided (step S1). A material is formed on the printed circuit board, and disposed between pins of the devices (step S2). Then, the solder bumps are formed on the pins of the devices so that the devices are fixed on the printed circuit board (step S3).

In step S3, for example, the printed circuit board is passed through an infrared oven to melt the solder bumps, and extra solder bumps other than those attached to the device pins are removed. The step S3 is not restricted within the above example; that is, the method as disclosed in this invention is not limited to a soldering manner using the infrared oven. For instance, the method as disclosed in this invention can be applied to manual soldering.

As a result, the material separates the solder bumps attached to the pins of the devices so that the devices are prevented from short circuiting. Specifically, as shown in FIG. 4, the material 22a, 22b is formed between the solder bumps 21 on the printed circuit board 20. Thus, the quality of the solder bumps 21 can be improved.

Figure 1A:
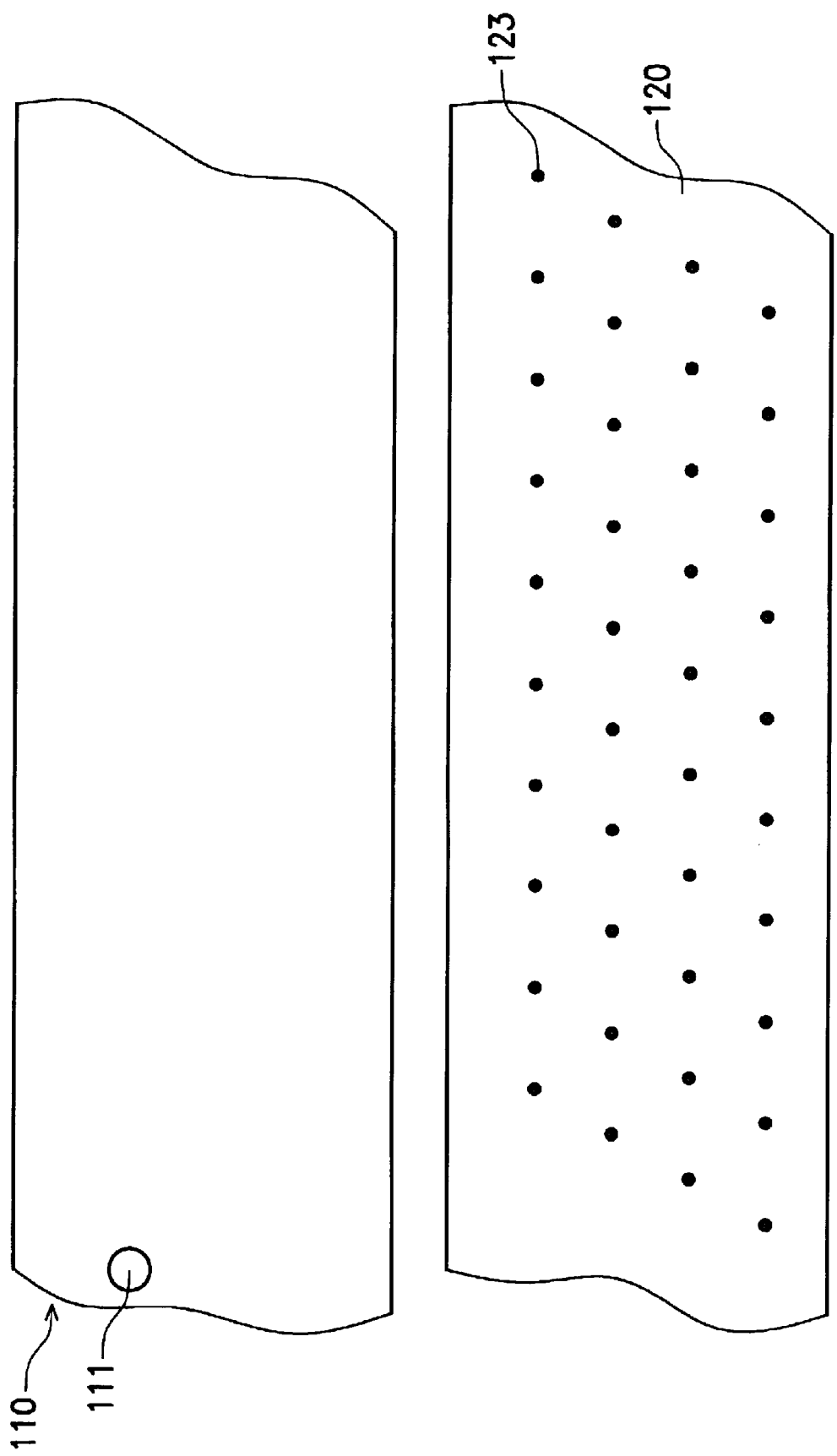
FIG. 1a is a schematic view depicting a conventional apparatus for printing characters on a printed circuit board.
Figure 1B:
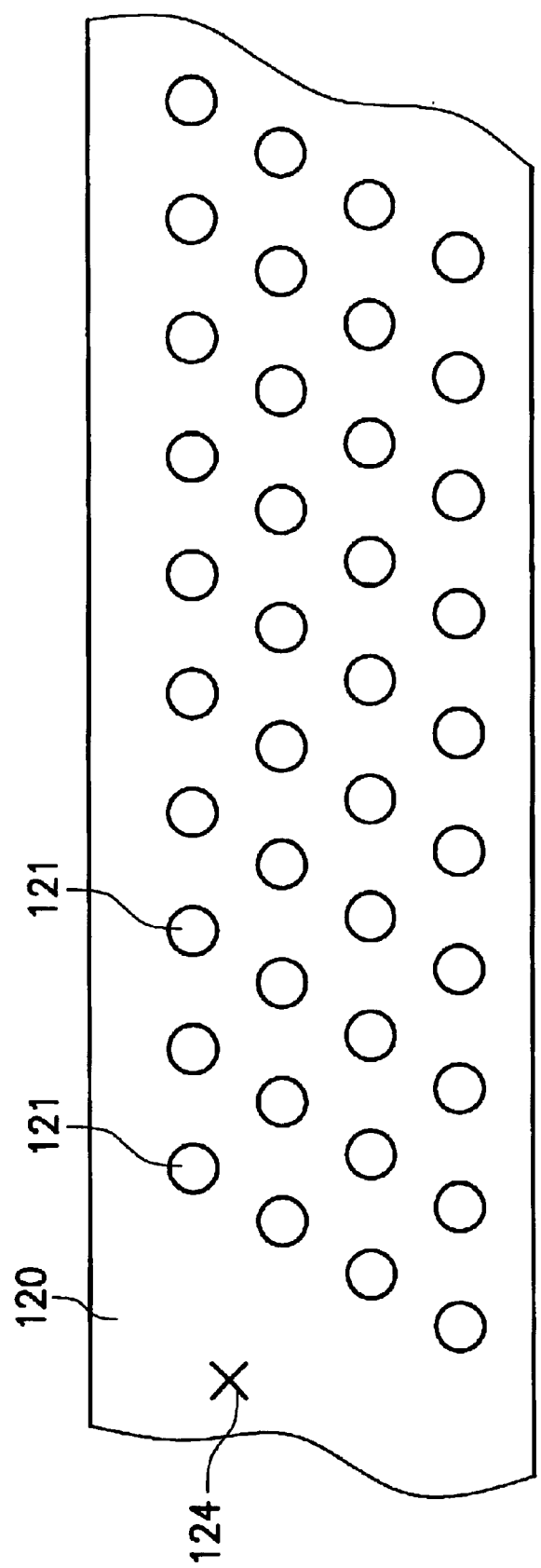

Comparing FIG. 1a with FIG. 4, since the material 22a, 22b is formed between the solder bumps 21 on the printed circuit board 20 as shown in FIG. 4, the solder bumps 21, fabricated by the method as disclosed in this invention, can be removed more easily.

It is noted that the material 22a, 22b can be formed on the printed circuit board 20 by screen-printing or coating; therefore, the fixture 10 can be a screen-printing fixture. However, the fixture is not limited. In addition, the material 22a, 22b may be a normal indication marker for the printed circuit board, such as white paint. However, the material is also not limited to the normal indication marker.

The solder bump fabrication method and apparatus has the following advantages:

1. Since the material 22a, 22b is formed between the solder bumps 21 on the printed circuit board 20, there are additional isolating portions between the solder bumps attached to the pins of the devices. Thus, extra solder bumps are easily removed, and the devices on the printed circuit board are prevented from short-circuiting.

2. The loss rate of the fabricated printed circuit board is lowered, and the proportion of rework of the fabricated printed circuit board is also lowered.

3. Since the proportion of rework is lowered, the detection cost is lowered.

4. Since the material is disposed when the character is printed, the fabrication cost and time do not increase.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A method for preventing short circuiting of solder bumps in chip-on-board technology, comprising:
    (a) providing a chip-on-board printed circuit board having a plurality of devices; and
    (b) forming a material on the chip-on-board printed circuit board, wherein the material is disposed between pins of the devices so that the material prevents the devices from short circuiting due to the solder bumps.

2. The method as claimed in claim 1, further comprising:
    (c) forming the solder bumps on the pins of the devices so that the devices are fixed on the printed circuit board.

3. The method as claimed in claim 2, further comprising:
    (d) passing the printed circuit board through an infrared oven to melt the solder bumps; and
    (e) removing extra solder bumps other than those attached to the device pins, wherein the solder bumps attached to the device pins are separated by the material so that the devices are prevented from short circuiting.

4. The method as claimed in claim 1, wherein the material is formed on the printed circuit board by screen printing in step (b).

5. The method as claimed in claim 1, wherein the material is formed on the printed circuit board by coating in step (b).

6. The method as claimed in claim 1, wherein the material is an indication marker for the printed circuit board.

7. The method as claimed in claim 1, wherein the material is white paint.

8. A method for fabricating solder bumps comprising:
    (a) providing a printed circuit board having a plurality of devices;
    (b) forming a material on the printed circuit board, wherein the material is disposed between pins of the devices so that the material prevents the devices from short circuiting due to the solder bumps;
    (c) forming the solder bumps on the pins of the devices so that the devices are fixed on the printed circuit board;
    (d) passing the printed circuit board through an infrared oven to melt the solder bumps; and
    (e) removing extra solder bumps other than those attached to the device pins, wherein the solder bumps attached to the device pins are separated by the materials so that the devices are prevented from short circuiting.

9. The method as claimed in claim 8, wherein the material is formed on the printed circuit board by screen printing in step (b).

10. The method as claimed in claim 8, wherein the material is formed on the printed circuit board by coating in step (b).

11. The method as claimed in claim 8, wherein the material is an indication marker for the printed circuit board.

12. The method as claimed in claim 8, wherein the material is white paint.

13. A method for preventing short circuiting of solder bumps comprising:
    (a) providing a printed circuit board having a plurality of devices; and
    (b) forming a material on the printed circuit board, wherein the material is an indication marker for the printed circuit board, and is disposed between pins of the devices so that the material prevents the devices from short circuiting due to the solder bumps.

14. The method as claimed in claim 13, further comprising:

c) forming the solder bumps on the pins of the devices so that the devices are fixed on the printed circuit board.

15. The method as claimed in claim 13, further comprising:

(d) passing the printed circuit board through an infrared oven to melt the solder bumps; and (e) removing extra solder bumps other than those attached to the device pins, wherein the solder bumps attached to the device pins are separated by the material so that the devices are prevented from short circuiting.

16. The method as claimed in claim 13, wherein the material is formed on the printed circuit board by screen printing in step (b).

17. The method as claimed in claim 13, wherein the material is formed on the printed circuit board by coating in step (b).

18. The method as claimed in claim 13, wherein the material is white paint.

* * * * *